United States Patent

Gruber et al.

[11] Patent Number: 5,156,883
[45] Date of Patent: Oct. 20, 1992

[54] PROCESS FOR DEPOSITING A CERAMIC COATING ON A FILAMENT

[75] Inventors: Philip Gruber, Tubingen, Fed. Rep. of Germany; Ashleigh M. Kewney, Hounslow; Robert A. Shatwell, Hampshire, both of England

[73] Assignee: The British Petroleum Company P.L.C., London, England

[21] Appl. No.: 727,318

[22] Filed: Jul. 2, 1991

Related U.S. Application Data

[63] Continuation of Ser. No. 514,780, Apr. 25, 1990, abandoned.

[30] Foreign Application Priority Data

May 4, 1989 [GB] United Kingdom ............... 8910181

[51] Int. Cl.$^5$ ..................... B05D 3/14; B05D 5/12; C23C 16/00
[52] U.S. Cl. .................... 427/593; 427/118; 427/120; 427/249; 427/248.1; 427/419.7; 427/314
[58] Field of Search ............... 427/52, 50, 249, 248.1, 427/314, 118, 120, 419.7; 118/725; 428/367, 368, 366

[56] References Cited

U.S. PATENT DOCUMENTS

| | | | |
|---|---|---|---|
| 3,367,304 | 2/1968 | Robbins | 118/718 |
| 3,479,205 | 11/1969 | Morelock | 427/52 |
| 3,622,369 | 11/1971 | Basche et al. | 427/52 |
| 4,068,037 | 1/1978 | Debolt et al. | 428/368 |
| 4,127,659 | 11/1978 | Debolt et al. | 427/249 |
| 4,315,968 | 2/1982 | Suplinskas et al. | 428/367 |
| 4,358,473 | 11/1982 | Debolt et al. | 427/10 |
| 4,437,041 | 3/1984 | Roberts | 315/248 |
| 4,481,257 | 11/1984 | Suplinskas et al. | 428/366 |

Primary Examiner—Shrive Beck
Assistant Examiner—Roy V. King
Attorney, Agent, or Firm—Larry W. Evans; David J. Untener; Teresan W. Gilbert

[57] ABSTRACT

A process for depositing a ceramic coating on a filament, which comprises heating the filament by passage of an electric current via at least two electrodes, and passing the heated filament through a deposition chamber containing games which on contact with the hot filament deposit the required coating; characterized in that after deposition of the coating, the coated filament passes through an electrode containing a liquid metal mixture which is a mercury/indium or mercury/cadmium amalgam or a gallium/indium mixture.

17 Claims, 1 Drawing Sheet

PROCESS FOR DEPOSITING A CERAMIC COATING ON A FILAMENT

This is a continuation of co-pending application Ser. No. 07/514,780 filed on Apr. 25, 1990 now abandoned.

The present invention relates to a process for depositing a ceramic coating on a filament.

It is well known to deposit ceramic coatings on filaments using chemical vapour deposition (CVD) techniques. In a typical process, a heated filament is passed continuously through a deposition chamber. Conveniently, the filament is heated by passage of an electric current, and the electric current is supplied via mercury electrodes through which the wire passes. Such processes are described in, for example, U.S. Pat. Nos. 4,127,659 and 3,622,369.

Problems can arise when the surface of the filament presented to mercury in an electrode is of low conductivity. For example, in the case where a tungsten filament is coated with silicon carbide, it is generally easy to pass current to the tungsten filament at an electrode at the entry to the deposition chamber, and much more difficult to pass current at an electrode at the exit from the deposition chamber, when the tungsten filament carries a layer of silicon carbide.

Figure 1:
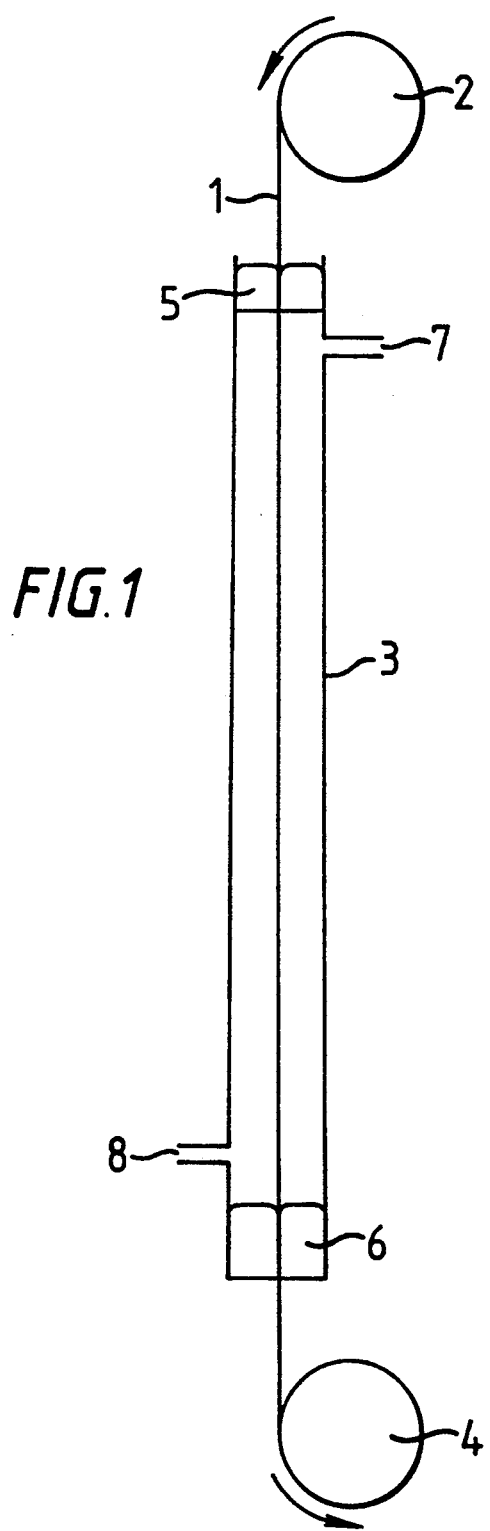
FIG. 1 describes an apparatus which may be used to carry out the process of the invention of depositing a ceramic coating on a filament.

We have now found that the problems can be reduced and a high quality product produced by using a defined metal mixture rather than pure mercury in an electrode.

Accordingly, the present invention provides a process for depositing a ceramic coating on a filament, which comprises heating the filament by passage of an electric current via at least two electrodes, and passing the heated filament through a deposition chamber containing gases which on contact with the hot filament deposit the required coating; characterized in that after deposition of the coating, the coated filament passes through an electrode containing a liquid metal mixture which is a mercury/indium or mercury/cadmium amalgam or a gallium/indium mixture.

If the liquid metal mixture is a mercury/indium or mercury/cadmium amalgam, the amount of indium or cadmium present in the amalgam is preferably in the range of from 0.5 to 8%, preferably from 1 to 6%, by weight. If the liquid metal mixture is a gallium/indium mixture, this preferably contains from 10 to 25% w of indium, and is preferably the eutectic mixture. Preferably the liquid metal mixture is a mercury/indium amalgam.

The design of electrode is not important, any known design being suitable for use with a metal mixture in accordance with the invention. In some designs of CVD reactor, there is a pressure difference between the upper and lower surfaces of the conducting pool. In such a case, it is desirable for the design of the electrode to incorporate a pressure equalisation device, to stop gases bubbling through the pool.

The process of the present invention may be used for depositing any desired ceramic coating on a filament. The filament may for example be tungsten or carbon. Typical ceramic coatings include boron and silicon carbide. The process may of course be used to deposit an additional ceramic layer over an existing ceramic layer, for example boron over silicon carbide or silicon carbide over boron. U.S. Pat. Nos. 4,068,307; 4,315,968; 4,340,636; 4,481,257; 4,628,002 and 4,702,960 describe various ceramic-coated filaments which can be produced by the process of the present invention. The process is particularly advantageous when depositing silicon carbide on a tungsten filament. Suitable gases used to deposit silicon carbide include haloalkylsilanes, such as methyltrichlorosilane, methyldichlorosilane or dimethyldichlorosilane, together with hydrogen. Alternatively, silicon tetrachloride or monosilane together with a hydrocarbon, for example methane, and hydrogen, may be used. Advantageously, a minor amount of carbon dioxide is included in the gases. Preferably the gases contain less than 2%, especially less than 1%, but more than 0.05%, preferably more than 0.1%, by volume of carbon dioxide.

In the process according to the invention, at least one electrode through which the coated filament passes contains the defined liquid metal mixture. An apparatus for carrying out the deposition process may of course contain a number of electrodes, any or all of which may contain the defined liquid metal mixture. A particular process may involve a number of discrete deposition zones. In addition, a process may incorporate one or more cleaning zones in which the filament is cleaned prior to deposition of a coating. If in such a process, a filament having a ceramic coating passes through more than one electrode, each such electrode may contain the defined liquid metal mixture.

The invention also provides an apparatus for depositing a ceramic coating on a filament, which comprises a deposition chamber and at least two electrodes, the arrangement being such that in use, a filament is heated by passage of an electric current via the electrodes, the heated filament being passed through the deposition chamber containing gases which on contact with the hot filament deposit the required coating; characterized in that the electrode through which, in use, the filament passes after deposition, contains a liquid metal mixture which is a mercury/indium or mercury/cadmium amalgam or a gallium/indium mixture.

The products produced by the process of the invention are of high quality. In particular, the use of the defined metal mixture leads to a product with improved tensile strength.

The process and apparatus of the invention are illustrated in the accompanying drawing, FIG. 1, which shows an apparatus which may be used to carry out the process of the invention. A filament 1, for example tungsten, is fed from a supply 2 via a tube 3 to a store 4. The filament 1 passes through a mercury electrode 5 at the upper end of the tube 3, and an electrode 6 at the lower end of the tube 3, which contains a mercury/indium or mercury/cadmium amalgam or a liquid gallium/indium mixture. The electrodes 5 and 6 form part of an electric current circuit (not shown) which supplies an electric heating current to the filament 1. Gases which on contact with the hot filament deposit the desired ceramic coating, are fed into the tube 2 via inlet 7, and removed via outlet 8.

In comparison experiments, the liquid metal mixture in electrode 6 may be replaced by pure mercury. On start-up of the process, arcing occurs at electrode 6. In some runs, this causes the filament 1 to break. In other runs, the coating deposited on the finished product is pitted and of much reduced tensile strength.

We claim:

1. A process for depositing a ceramic coating on a filament, which comprises heating the filament by passage of an electric current via at least two electrodes, and passing the heated filament through a deposition chamber containing gases which on contact with the hot filament deposit the required coating thereon; characterized in that after deposition of the coating, the coated filament passes through an electrode containing a liquid metal mixture which is a mercury/indium or mercury/cadmium amalgam or a gallium/indium mixture.

2. A process as claimed in claim 1, in which the liquid metal mixture is a mercury/indium or mercury/cadmium amalgam, and the amount of indium or cadmium present in the amalgam is in the range of from 0.5 to 8% by weight, or the liquid metal mixture is a gallium/indium mixture containing from 10 to 25% of indium.

3. A process as claimed in claim 2, in which the amount of indium or cadmium present in an amalgam is in the range of from 1 to 6% by weight, or a gallium/indium mixture is the eutectic mixture.

4. A process as claimed in claim 2, in which the liquid metal mixture is a mercury/indium amalgam.

5. A process as claimed in claim 2, in which a coating of boron or silicon carbide is deposited on a tungsten or carbon filament.

6. A process as claimed in claim 2, in which an additional ceramic layer is deposited over an existing ceramic layer.

7. A process as claimed in claim 3, in which the liquid metal mixture is a mercury/indium amalgam.

8. A process as claimed in claim 3, in which a coating of boron or silicon carbide is deposited on a tungsten or carbon filament.

9. A process as claimed in claim 3, in which an additional ceramic layer is deposited over an existing ceramic layer.

10. A process as claimed in claim 1, in which the liquid metal mixture is a mercury/indium amalgam.

11. A process as claimed in claim 10, in which a coating of boron or silicon carbide is deposited on a tungsten or carbon filament.

12. A process as claimed in claim 10, in which an additional ceramic layer is deposited over an existing ceramic layer.

13. A process as claimed in claim 1, in which a coating of boron or silicon carbide is deposited on a tungsten or carbon filament.

14. A process as claimed in claim 13, in which a coating of silicon carbide is deposited on a tungsten filament.

15. A process as claimed in claim 13, in which an additional ceramic layer is deposited over an existing ceramic layer.

16. A process as claimed in claim 1, in which an additional ceramic layer is deposited over an existing ceramic layer.

17. A process for depositing a ceramic coating on a filament, which comprises heating the filament by passage of an electric current via at least two electrodes, and passing the heated filament through a deposition chamber containing gases, which on contact with the hot filament deposit the required coating thereon; wherein an additional ceramic layer is deposited over an existing ceramic layer and wherein after deposition of the coating, the coated filament passes through an electrode containing a liquid metal mixture selected from the group consisting of mercury/indium, mercury/cadmium amalgam and a gallium/indium mixture.

* * * * *